(12) United States Patent
Gong et al.

(10) Patent No.: US 10,727,804 B2
(45) Date of Patent: Jul. 28, 2020

(54) CHIP-SCALE RESONANT GYRATOR FOR PASSIVE NON-RECIPROCAL DEVICES

(71) Applicant: The Board of Trustees of the University of Illinois, Urbana, IL (US)

(72) Inventors: Songbin Gong, Champaign, IL (US); Ruochen Lu, Champaign, IL (US); Tomas Manzaneque Garcia, Champaign, IL (US); Cheng Tu, Urbana, IL (US); Daniel Shoemaker, Urbana, IL (US); Chengxi Zhao, Urbana, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 402 days.

(21) Appl. No.: 15/790,999

(22) Filed: Oct. 23, 2017

(65) Prior Publication Data
US 2018/0115294 A1    Apr. 26, 2018

Related U.S. Application Data

(60) Provisional application No. 62/411,710, filed on Oct. 24, 2016.

(51) Int. Cl.
*H03H 7/00* (2006.01)
*H03C 1/46* (2006.01)
(Continued)

(52) U.S. Cl.
CPC .......... *H03H 7/002* (2013.01); *H01F 10/126* (2013.01); *H01F 10/20* (2013.01); *H01F 10/265* (2013.01);
(Continued)

(58) Field of Classification Search
CPC ...... H03H 7/002; H03H 2/001; H01F 10/126; H01F 10/265; H01F 21/08; H01F 10/20; H01L 41/00; H03C 1/46
See application file for complete search history.

(56) References Cited

U.S. PATENT DOCUMENTS

| | | |
|---|---|---|
| 2,834,943 A | 5/1958 | Grisdale et al. |
| 3,134,082 A | 5/1964 | Arlt |

(Continued)

OTHER PUBLICATIONS

"Thin-Film Bulk Acoustic Resonator," Wikipeda, https://en.wikipedia.org/wiki/Thin-film_bulk_acoustic_resonator, 2 pages, Apr. 3, 2017, retrieved on Oct. 13, 2017.
(Continued)

*Primary Examiner* — Bryan P Gordon
(74) *Attorney, Agent, or Firm* — Lowenstein Sandler LLP

(57) ABSTRACT

An integrated circuit is a layered device, on a semiconductor substrate, which contains metal electrodes that sandwich a piezoelectric layer, followed by a magnetostrictive layer and a metal coil. The metal electrodes define an electrical port across which to receive an alternating current (AC) voltage, which is applied across the piezoelectric layer to cause a time-varying strain in the piezoelectric layer. The magnetostrictive layer is to translate the time-varying strain, received by way of a vibration mode from interaction with the piezoelectric layer, into a time-varying electromagnetic field. The metal coil, disposed on the magnetostrictive layer, includes a magnetic port at which to induce a current based on exposure to the time-varying electromagnetic field generated by the magnetostrictive layer.

18 Claims, 5 Drawing Sheets

(51) Int. Cl.
*H03H 2/00* (2006.01)
*H01F 10/12* (2006.01)
*H01F 10/26* (2006.01)
*H01F 21/08* (2006.01)
*H01L 41/00* (2013.01)
*H01F 10/20* (2006.01)

(52) U.S. Cl.
CPC ............ *H01F 21/08* (2013.01); *H01L 41/00* (2013.01); *H03C 1/46* (2013.01); *H03H 2/001* (2013.01)

(56) References Cited

U.S. PATENT DOCUMENTS

| | | | | |
|---|---|---|---|---|
| 4,675,682 | A * | 6/1987 | Adam | H01Q 3/2688 333/147 |
| 2005/0194863 | A1* | 9/2005 | Viehland | H01L 41/00 310/311 |
| 2006/0279171 | A1* | 12/2006 | Viehland | H01F 10/126 310/311 |
| 2008/0203855 | A1 | 8/2008 | Viehland et al. | |
| 2008/0211491 | A1* | 9/2008 | Huang | A61N 1/3787 324/209 |
| 2014/0253272 | A1* | 9/2014 | Sun | H01F 41/34 336/30 |

OTHER PUBLICATIONS

Dong, S., et al., "Enhanced Magnetoelectric Effects in Laminate Composites of Terfenoz-D/Pb(Zr,Ti)O 3 Under Resonant Drive," Applied Physics Letters, vol. 83, No. 23 pp. 4812-4814, Dec. 8, 2003.

Estep, Nicholas A., et al., "Magnetic-Free Non-Reciprocity and Isolation based on Parametrically Modulated Coupled-Resonator Loops," Nature Physics, vol. 10, pp. 923-927, Dec. 2014, published online Nov. 10, 2014.

McMillan, E.M., "Violation of the Reciprocity Theorem in Linear Passive Electromechanical Systems," Journal of the Acoustical Scoiety of America, vol. 18, No. 2 pp. 344-347, Oct. 1946.

Reiskarimian, N. et al., "Magnetic-Free Non-Reciprocity Based on Staggered Commutation," Nature Communications, vol. 7, 10 pages, published Apr. 15, 2016.

Silverman J.H, "The Electromechanical Circulator," Compon, Parts, IRE Transactions on Component Parts, vol. 9, No. 2, pp. 81-85, Jun. 1962.

Tellegen, B.D.H., "The Gyrator, A New Electric Network Element," Philips Res. Rept., vol. 3, 81-101, pp. 388-409, Apr. 1948.

Wada, T., et al. "A Miniaturized Broadband Lumped Element Circulator for Reconfigurable Front-End System," in Microwave Symposium (IMS), 2014 IEEE MTT-S International, 3 pages, 2014.

Zhai, M.I., et al., "A Quasi(Unidirectional) Tellegen Gyrator," Journal of Applied Physics, vol. 100, No. 12, p. 124509-1 to 124509-3, 2006.

* cited by examiner

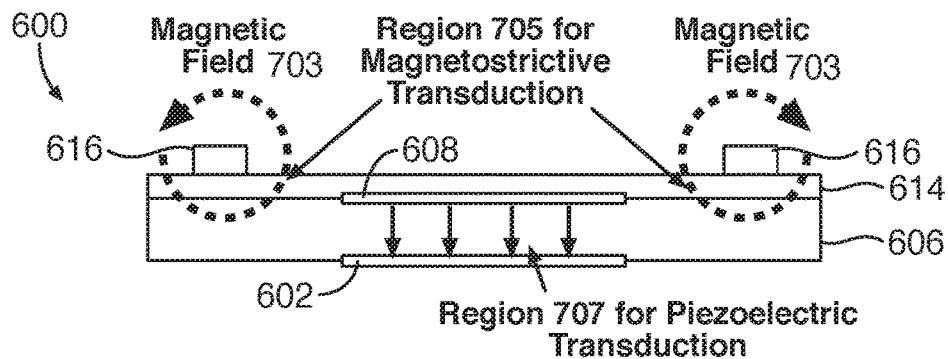
FIG. 7
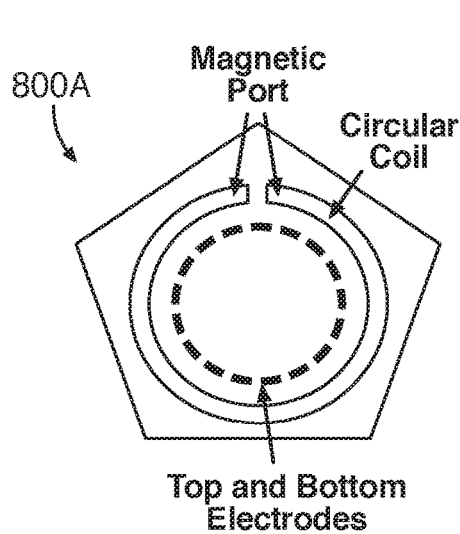
FIG. 8A
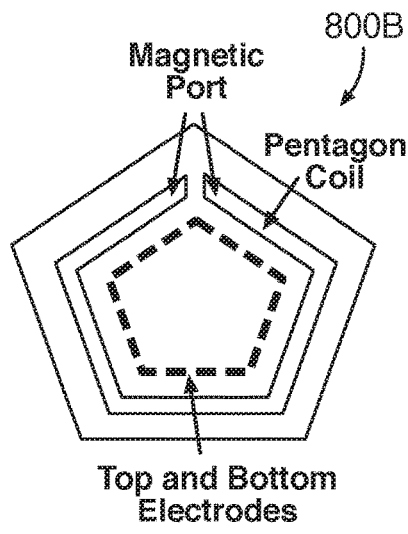
FIG. 8B
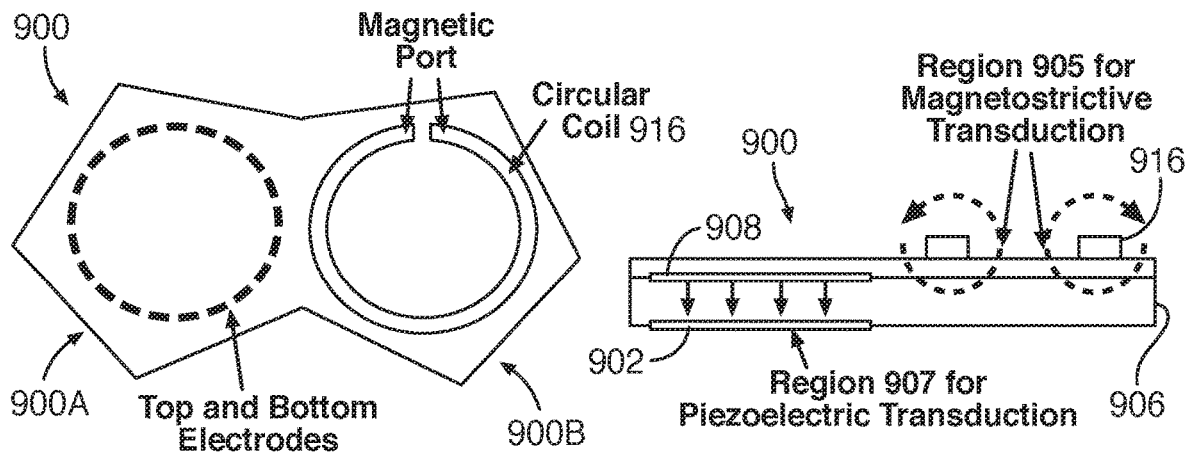
FIG. 9A
FIG. 9B

US 10,727,804 B2

CHIP-SCALE RESONANT GYRATOR FOR PASSIVE NON-RECIPROCAL DEVICES

REFERENCE TO EARLIER FILED APPLICATION

This application claims the benefit under 35 U.S.C. § 119(e) of U.S. Provisional Patent Application No. 62/411,710, filed Oct. 24, 2016, which is incorporated herein, in its entirety, by this reference.

FEDERALLY SPONSORED RESEARCH OR DEVELOPMENT

This disclosure was made with government support under HR0011-17-2-0004 awarded, in conjunction with the Signal Processing at Radio Frequency (SPAR) program, by the Defense Advanced Research Projects Agency's (DARPA's) Micro-Systems Technology Office. The government has certain rights in the invention.

BACKGROUND

A gyrator is a passive, linear, lossless, two-port electrical network element proposed in 1948 by Bernard D. H. Tellegen as a hypothetical fifth linear element after the passive network elements of the resistor, capacitor, inductor, and ideal transformer. Unlike these elements, the gyrator is non-reciprocal. By virtue of Tellegen's theorem, any multiport network formed by combinations of resistor, capacitor, inductor, and ideal transformer elements has a symmetrical S-parameters matrix, and therefore meets the principle of reciprocity. Reciprocity is the relationship between an oscillating (e.g., alternating) current and the resulting electric field, which remains unchanged if one interchanges the points where the current is placed and where the field is measured. For the specific case of an electrical network, it may also be said that voltages and currents at different points in the network can be interchanged.

A non-reciprocal device like a gyrator, on the other hand, is a device that transmits a signal unchanged in the forward direction between two ports, but reverses the polarity of the signal traveling in the backward direction, e.g., resulting in a 180° phase-shift in the backward traveling signal as compared to the forward direction.

As it was envisioned in the 1940s, the properties of magnetic materials can be exploited to build passive devices that break the principle of reciprocity. Such passive devices may include, for example, gyrators and circulators. A circulator is a passive non-reciprocal three-port or four-port device, in which a microwave or radio frequency signal entering any port is transmitted only to the next port in rotation. A port in this context is a point where an external waveguide or transmission line (such as a microstrip line or a coaxial cable), connects to the device. For a three-port circulator, a signal applied to port 1 only comes out of port 2; a signal applied to port 2 only comes out of port 3; a signal applied to port 3 only comes out of port 1, so to within a phase-factor, the scattering matrix for an ideal three-port circulator is:

$$S = \begin{pmatrix} 0 & 0 & 1 \\ 1 & 0 & 0 \\ 0 & 1 & 0 \end{pmatrix}.$$

Circulators based on ferrites are currently widespread. The main limitation of these devices is their electromagnetic (EM) wavelengths, particularly at lower RF frequencies, e.g., less than 1.5 GHz. Circulators based on ferrites, however, are too large and are certainly incompatible with use at chip scale, e.g., within integrated circuits.

Recent attempts of getting size-manageable non-reciprocal devices are based on modulation. These approaches suffer from noise introduced by dynamic biasing sources (phase noise in oscillators or jitter in the clocks) or noise folding effect due to harmonics. Furthermore, these approaches produce either the intermodulation between in-band signals due to the nonlinear capacitance/voltage curve of the varactors, or cross-modulations between in-band signals and the basing (and their harmonics) due to the switching-enabled modulation. These effects present new challenges that are germane to active device techniques.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 7 is a cross-sectional view of the schematic diagram of FIG. 6B, illustrating magnetostrictive and piezoelectric transduction, according to one embodiment.

FIGS. 8A and 8B are a top plane view of a pentagonal-shaped gyrator according to two embodiments.

FIGS. 9A and 9B are a top plane view and a cross-sectional view, respectively, of a magneoelectric MEMS gyrator with separated magnetostrictive and piezoelectric transduction areas.

DETAILED DESCRIPTION

Figure 1:
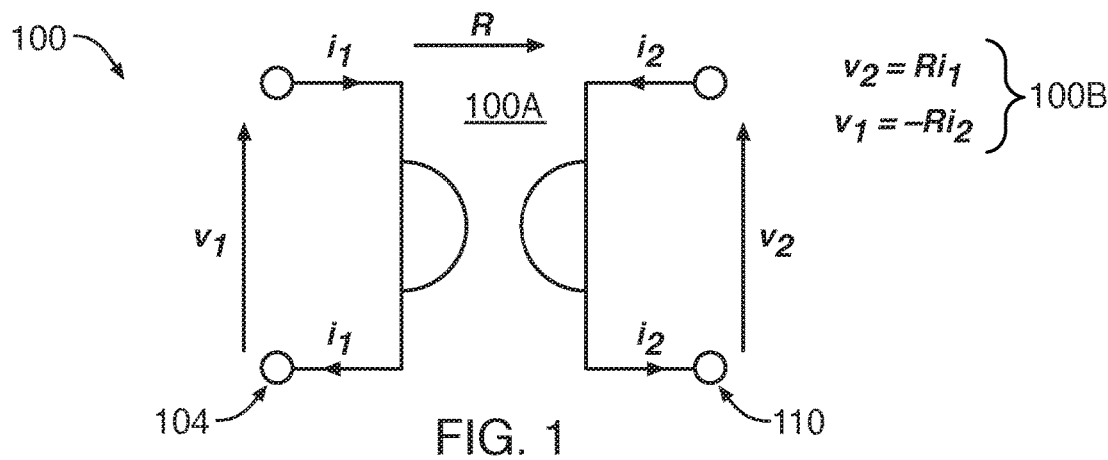
FIG. 1 is a schematic diagram illustrating the symbol and model of an ideal gyrator, according to one embodiment.

By way of introduction, the present disclosure relates to a chip-scale anti-reciprocal platform based on electromechanical elements and on integrated circuit processes, such as complementary metal-oxide-semiconductor (CMOS) integrated circuit (IC) processes. In one embodiment, for example, an integrated circuit gyrator may be formed through a layering process to create the following layers. A first metal electrode may be disposed on a semiconductor substrate, the first metal electrode having a first lead. A piezoelectric layer may be disposed on the first metal electrode, and a second metal electrode may be disposed on the piezoelectric layer. The second metal electrode may include a second lead that, together with the first lead, forms an electrical port. A magnetostrictive layer may be disposed on the second metal electrode. A metal coil having a magnetic port may be disposed on the magnetostrictive layer. A permanent magnetic may also be added to either side of the layered gyrator to create a static magnetic biasing field, to bias operation of the gyrator in a linear region. These layers may substantially complete a passive gyrator at chip-scale, although additional layers may be used in some embodiments.

In forward transduction of the resulting gyrator, injecting an alternating-current (AC) current into the metal coil through the magnetic port may create a magnetic field through the layers of the gyrator, which in turn may cause the magnetostrictive layer to vibrate vertically due to the magnetostrictive effect. At the resonant frequency of a piezoelectric resonator and a magnetic resonator, the bi-layer structure of the piezoelectric layer and the magnetostrictive layer may be excited to a vibration mode. Because of the piezoelectric effect, the mechanical vibration in the piezoelectric layer leads to a charge variation and thus induces a current at the electrical port.

In backward transduction of the resulting gyrator, an AC voltage applied across the electrical port applies the AC voltage across the piezoelectric layer, causing a reverse piezoelectric effect in which the AC voltage causes a time-varying strain with the piezoelectric layer. This time-varying strain may hit a vibration mode of the bi-layer structure, causing the magnetostrictive layer to translate the time-varying strain into a time-varying electromagnetic field in an inverse magnetostrictive effect. The time-varying electromagnetic field may induce a current at the magnetic port based on the time-varying electromagnetic field generated by the magnetostrictive layer. The current induced at the magnetic port in backward transduction may be 180 degrees out of phase with the current induced at the electrical port in forward transduction.

To form a circulator, one may add matching networks to a flip-chipped, glass substrate layer that provide for inductive-capacitive matching with a transmitter on one side of the gyrator and with a receiver on another side of the gyrator. Operating in the mechanical domain, the proposed gyrator and circulator may have a thickness comparable to an acoustic wavelength that exists at 1 GHz. Lateral dimensions of the gyrator and circulator are collectively determined by allowed magnetic biasing field, power handling/linearity, and size of matching networks. Nonetheless, based on a model that will be further described, the disclosed approach allows for orders of magnitude smaller size than ferrite-based circulators. The disclosed gyrator and circulator, furthermore, may achieve a low noise figure and high linearity compared with active (e.g., modulated) versions. In addition, the disclosed resonator-based system is expected to be smaller than modulation-based ones, since it does not require sources and interconnects for biasing.

In one embodiment, the proposed gyrator and circulator may use aluminum nitride (AlN) for the piezoelectric layer and manganese ferrite ($MnFe_2O_4$) for the magnetostrictive layer. In further embodiments, the piezoelectric layer may be of $BaTiO_3$, PZT, PMN-PT, $BiFeO_3$, $LiNbO_3$, and the magnetostrictive layer $Fe_3O4$, $CoFe_2O_4$, and the like; yttrium iron garnet (YIG); and hexagonal ferrites such as $BaFe_{12}O_{19}$. Some works have reported on the gyration characteristics of laminate composites of PZT (piezoelectric) and Terfenol-D (piezomagnetic) operated at a lateral vibration mode. Compared to these materials, the disclosed chosen materials, AlN for piezoelectric layer and $MnFe_2O_4$ for magnetostrictive material, have lower acoustic and magnetic losses at radio frequencies and a higher ferromagnetic resonance to accommodate operation at 1 GHz. The materials also all can be sputtered on semiconductor substrates, and consequently compatible with CMOS or other radio frequency integrated circuit platforms for integration.

FIG. 1 is a schematic diagram illustrating the symbol 100A and model 100B of an ideal gyrator 100, according to one embodiment. Note that the gyrator 100 includes a first port 104 on one side and a second port 110 on a second side of the gyrator 100, where R is the gyration resistance of the ideal gyrator 100. The gyration resistance (or equivalently its reciprocal, the gyration conductance) has an associated direction indicated by an arrow on the schematic diagram. In one embodiment, the given gyration resistance or conductance relates the voltage on the port at the head of the arrow (second port 110 in this case) to the current at its tail, or in other words, $v_2=Ri_1$. The voltage at the tail of the arrow is related to the current at its head by a negative of the stated resistance, or in other words, $v_1=-Ri_2$. Reversing the arrow is equivalent to negating the gyration resistance, or to reversing the polarity of either port.

Accordingly, the direction of the arrow is indicative of a forward direction of induction such that a current ($i_1$) inserted at the first port 104, following forward transduction, a reciprocal voltage is induced ($v_2=Ri_1$) at the second port 110, but a current ($i_2$) inserted at the second port 110 induces a non-reciprocal voltage ($v_1=-Ri_2$) at the first port 104, e.g., following backwards transduction.

Although the ideal gyrator 100 is characterized by its resistance value, it is a lossless component. For this ideal gyrator 100, the instantaneous power into the gyrator is identically zero, e.g., $$P=v_1i_1+v_2i_2=(-Ri_2)i_1+(Ri_1)i_2=0 \quad (1)$$

A property of a gyrator is that it inverts the current-voltage characteristic of an electrical component or network. In the case of linear elements, the impedance is also inverted. In other words, a gyrator can make a capacitive circuit behave inductively, or make a series LC circuit behave like a parallel LC circuit, and so on.

Figure 2A:
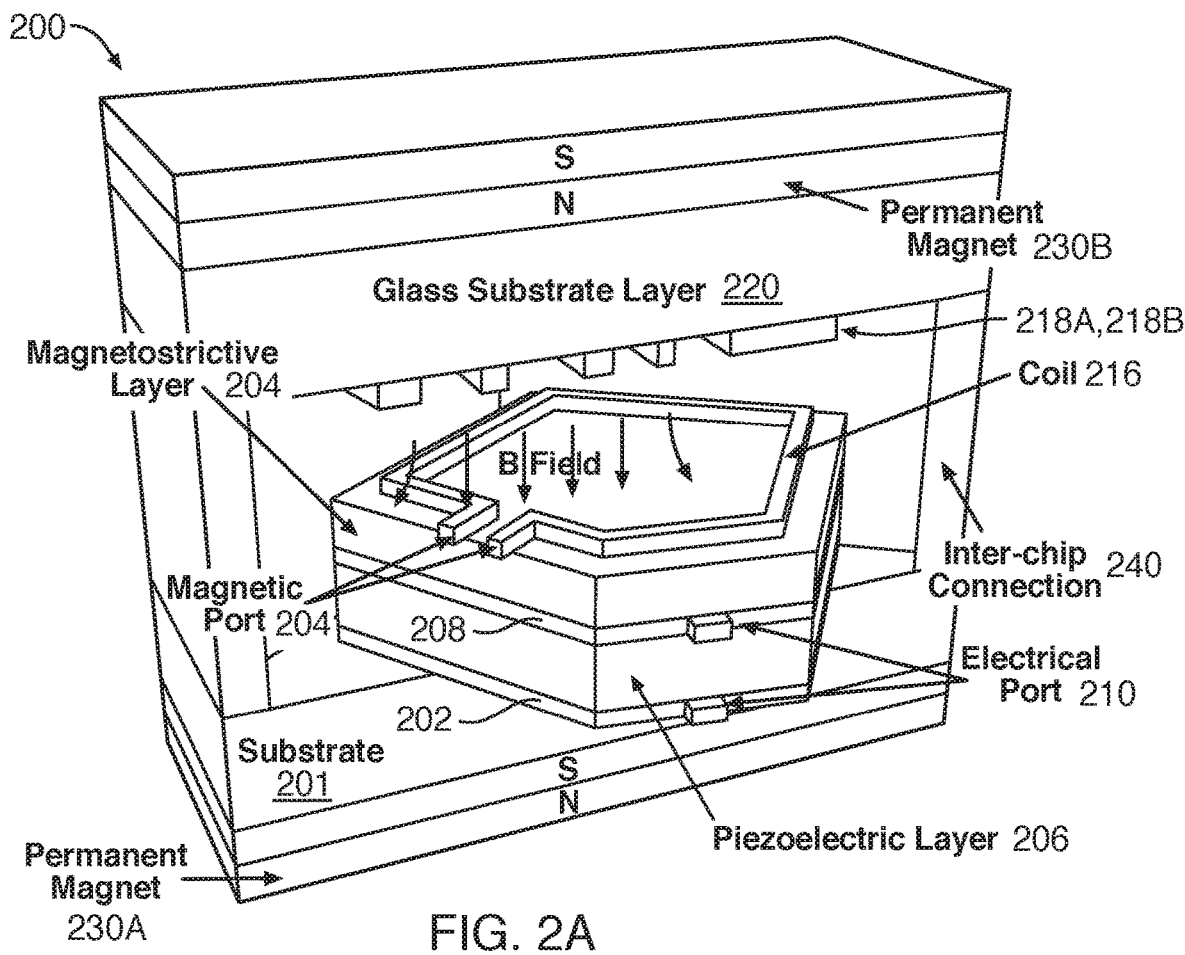
FIG. 2A is a perspective view of a chip-scale, electromechanical gyrator, according to various embodiments.

FIG. 2A is a perspective view of a chip-scale, electromechanical gyrator 200 (e.g., gyrator 200) according to various embodiments. The gyrator 200 may include, but not be limited to, a layered IC structure having a semiconductor substrate 201 (such as a silicon wafer), a first metal electrode 202 formed from a first metal layer, a piezoelectric layer 206, a second metal electrode 208 formed from a second metal layer, an electrical port 210 across the first metal electrode 202 and the second metal electrode 208, a magnetostrictive layer 214, and a metal coil 216 that is planar and that forms a magnetic port 204 on one end, e.g., where the circle shape is interrupted.

Another way to view the layered IC structure is a layered combination, in the thickness direction of the IC, of a piezoelectric resonator and a magnetic resonator. The piezoelectric resonator includes a combination of layers of the first metal electrode 202, the piezoelectric layer 206, and the second metal electrode 208. The magnetic resonator includes the magnetostrictive layer 214 and the planar metal coil 216 on top.

In various embodiments, the gyrator 200 may be formed relative to an inter-chip connection 240 and sandwiched between a first permanent magnetic 230A and a second permanent magnet 230A to apply a magnetic field bias to the gyrator 200, to statically and optimally bias operation of the gyrator 200 in the most linear region of the magnetostrictive material of the magnetostrictive layer 214. To optimally bias magnetostriction in $MnFe_2O_4$ in the most linear region, the biasing point has to accommodate max strain variation at the interface between the magnetostrictive and piezoelectric materials because demagnetized $MnFe_2O_4$ produces no strain when compressed. For strain produced by a 30 dBm power excitation to the electrical port 210, a magnetic biasing field of 200 mTelsa is required for a 500×500 μm device. Such biasing may be attained with the permanent magnets 230A and 230B, which may be flip-chip integrated over one or many gyrators in various implementations. To use the gyrator 200 as functional blocks for building standard 50Ω RF systems, matching networks may be added at the ports, as will be discussed in more detail with reference to FIG. 3.

The non-reciprocity of the gyrator 200 derives from the gyroscopic transduction between the mechanical and electrical domains in any magnetically-instigated transduction. In various implementations, the combination of both a reciprocal and an anti-reciprocal transduction mechanism results in an overall anti-reciprocal element. A thickness vibration mode of the gyrator 200 may also be more advantageous for integration, as the required biasing field is vertical, enabling easier assembling of the magnets as outer layers of the gyrator 200.

Accordingly, in forward transduction of the gyrator 200, injecting an alternating-current (AC) current into the metal coil 216 through the magnetic port 204 may create a magnetic field through the layers of the gyrator 200, which in turn may cause the magnetostrictive layer 214 to vibrate vertically due to the magnetostrictive effect. At the resonant frequency of a piezoelectric resonator and a magnetic resonator, the bi-layer structure of the piezoelectric layer 206 and the magnetostrictive layer 214 may be excited to a vibration mode. The vibration mode may be a first-order or second-order thickness vibration mode. Because of the piezoelectric effect, the mechanical vibration in the piezoelectric layer leads to a charge variation and thus induces a current at the electrical port.

In backward transduction of the gyrator 200, an AC voltage applied across the electrical port 210 applies the AC voltage across the piezoelectric layer 206, causing a reverse piezoelectric effect in which the AC voltage causes a time-varying strain with the piezoelectric layer. This time-varying strain may hit a vibration mode of the bi-layer structure, causing the magnetostrictive layer 214 to translate the time-varying strain into a time-varying electromagnetic field in an inverse magnetostrictive effect. The time-varying electromagnetic field may induce a current at the magnetic port 204 based on the time-varying electromagnetic field generated by the magnetostrictive layer 214. The current induced at the magnetic port 204 in backward transduction may be 180 degrees out of phase with the current induced at the electrical port 210 in forward transduction, thus producing a passive, non-reciprocal device.

In one embodiment of the gyrator 200, the piezoelectric layer 206 may be formed from aluminum nitride (AlN) and the magnetostrictive layer 214 may be formed from manganese ferrite ($MnFe_2O_4$), although other materials are envisioned. Aluminum nitride (AlN) may be chosen as piezoelectric material due to it high $d_{33}$ piezoelectric coupling, high acoustic quality factor, and high thermal conductivity. The two former properties facilitate attaining low insertion loss, while the latter helps in achieving high power handling and linearity. Regarding the piezomagnetic material, manganese ferrite ($MnFe_2O_4$) is chosen after a collection of magnetostrictive oxides has been surveyed in terms of dielectric and magnetic loss tangents, piezomagnetic coefficients, magnetic anisotropy, hysteresis, range of linear magnetostriction, and magnetization saturation. The disclosed approach reflects the requirements of high-frequency magnetostriction, not fulfilled by the typical materials seen in low frequency or DC magnetostrictive devices.

Figure 3:
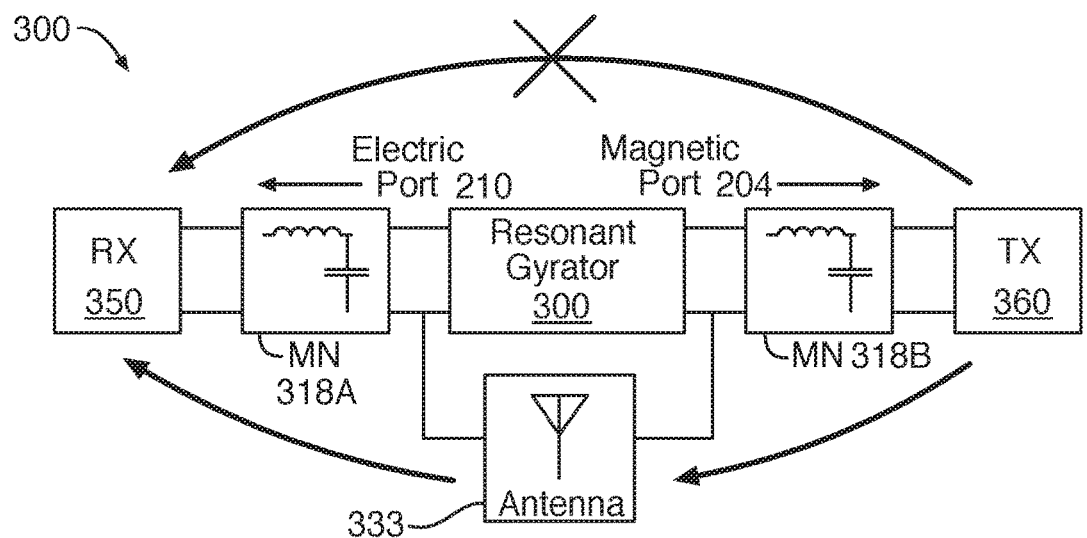
FIG. 3 is an electrical network diagram illustrating a single-frequency transceiver implemented with the gyrator of FIG. 2A, according to various embodiments.

In a further embodiment, to form a circulator from the gyrator 200, a glass substrate layer 220 may be employed onto which a first matching network 218A and a second matching network 218B may be flip-chip bonded. After flip-chip bonding, the first matching network 218A may be disposed on an inner side of the glass substrate layer 220 and coupled between the electrical port 210 and a radio frequency (RF) receiver (FIG. 3). The second matching network 218B may be disposed on the inner side of the glass substrate layer 220 and coupled between the magnetic port 204 and an RF transmitter (FIG. 3).

The IC layers of the gyrator 200, including the first metal electrode 202, second metal electrode 208, the piezoelectric layer 206, and the magnetostrictive layer 214 may be formed in a thin-film bulk acoustic resonator (FBAR or TFBAR) like configuration. A FBAR normally includes a piezoelectric material sandwiched between two electrodes and that is acoustically isolated from the surrounding medium. In this case, the magnetostrictive layer 214 is mechanically coupled to the FBAR and also acoustically isolated from the surrounding medium, allowing vertical vibrations to be passed between the piezoelectric layer 206 (or the piezoelectric resonator) and the magnetostrictive layer 214 (or the magnetic resonator) in a thickness vibration mode. The thickness vibration mode of the gyrator 200 is more advantageous for integration, as the biasing field is vertical, enabling for an easier assembling of the magnets in layers with the IC process.

Figure 2B:
FIG. 2B is a graph illustrating a cross-sectional displacement mode shape for the magnetostrictive and piezoelectric layers of the gyrator of FIG. 2A, according to one embodiment.

FIG. 2B is a graph illustrating a cross-sectional displacement mode shape for the magnetostrictive layer 214 and the piezoelectric layer 206 of the gyrator 200 of FIG. 2A in a second-order thickness mode. This second-order thickness mode allows for the distribution of the modal strain between the magnetostrictive and piezoelectric layers by carefully designing their thicknesses, e.g., a first thickness ($T_p$) of the piezoelectric layer and a second thickness ($T_m$) of the magnetostrictive layer 214. In various embodiments, the values for $T_P$ and $T_M$ may be chosen in such a way that identical resonant frequencies are obtained within the piezoelectric resonator and the magnetic resonator. In one embodiment, for example, a 1.7 GHz resonance can be achieved when $T_P$ and $T_M$ are chosen to be 4.7 μm and 1.8 μm, respectively.

In various additional embodiments, use of the layered, integrated chip platform of FIG. 2A on which to build a gyrator or a circulator may also be used to form other non-reciprocal electrical networks. Particularly, a three-port circulator is a device that allows for high power transmission between three ports following a specific rotation direction, and providing high isolation for the opposite direction. This kind of device can be built from the gyrator 200. Chip-scale circulators are desired in communication networks, as chip-scale circulators make possible single-frequency transceivers.

FIG. 3 is an electrical network diagram illustrating a single-frequency transceiver 300 implemented as a circulator with the gyrator 200 of FIG. 2A, according to various embodiments. The single-frequency transceiver 300 may include the gyrator 200, a first matching network 318A, a second matching network 318B, an antenna 333, a receiver (RX) 350 and a transmitter (TX) 360. The gyrator 200 may be coupled between the first matching network 318A and the second matching network 318B. For example, to provide the signal path propagation as indicated by the arrows in FIG. 3 (clockwise but not counter-clockwise), the first matching network 318A may be connected to the electrical port 210 of the gyrator 200 and to the RX 350, while the second matching network 318B may be connected to the magnetic port 204 of the gyrator 200 and to the TX 360. The antenna may be coupled between the electrical port 210 and the magnetic port 204 of the gyrator 200.

The single-frequency transceiver 300 provides high isolation and linearity between the TX 360 and the RX 350, which means low self-interference of the transceiver 300. The single-frequency transceiver 300 also provides low loss and high power handling between TX 360 and the antenna 333, and low noise figure between the antenna 333 and the RX 350. The single-frequency transceiver 300 may thus provide these characteristics with zero (or very little) power consumption. Due to the resonant nature of the gyrator, the desired specifications may be met at a certain frequency range around the resonant frequency. The overall bandwidth may be collectively determined by the quality factor of the gyrator 200 and the matching networks 318A and 318B.

Accordingly, the signal flow is in one direction, the direction in which the antenna is coupled in the signal flow path such that signals from the TX 360 flows to the antenna 333 but not the receiver, and signals received by the antenna 333 flows to the RX 350 and not the TX 360. This configuration prevents signal flow between the TX 360 and the RX 350, which would cause the receiver to saturate and interrupt signal receiving by the single-frequency transceiver 300.

The single-frequency transceiver 300 may therefore provide full duplex communication in a single RF radio. This design of the single-frequency transceiver 300 may eliminate the need for frequency domain duplexing in RF radios, allowing for simpler devices and more efficient use of the RF spectrum. For example, cell carriers are allowed a limited number of frequencies, so the single-frequency transceiver 300 of FIG. 3 may allow for twice the number of user device connections, e.g., in wireless handheld devices such as cell phones, tablets, and the like.

In various embodiments, a molecular beam vapor deposition (MBVD)-based model may be employed to simulate the response of the gyrator 200 having various dimensions and properties (FIG. 2A). The parameters gathered in Table 1 include dimensions used and assumed properties for purposes of simulated calculations.

TABLE 1

| Design Parameter | Symbol | Value |
| --- | --- | --- |
| Side length (μm) | L | 100 |
| AlN thickness (μm) | $t^{PE}$ | 6 |
| AlN stiffness (GPa) | $c_{33}^{PE}$ | 395 |
| AlN piezoelectric coupling (pm/V) | $d_{33}^{PE}$ | 5.5 |
| AlN relative permittivity | $\varepsilon_r^{PE}$ | 20 |
| AlN density (kg/m$^3$) | $\rho^{PE}$ | 2700 |
| Mn$_2$FeO$_4$ thickness (μm) | $t^{PM}$ | 1.55 |
| Mn$_2$FeO$_4$ stiffness (GPa) | $c_{33}^{PM}$ | 90 |
| Mn$_2$FeO$_4$ piezomagnetic coupling (nm/A) | $d_{33}^{PM}$ | 51 |
| Mn$_2$FeO$_4$ relative permeability | $\mu_r^{PM}$ | 10 |
| Mn$_2$FeO$_4$ density (kg/m$^3$) | $\rho^{PM}$ | 9200 |
| Number of turns of the coil | N | 1 |
| Quality factor | Q | 100 |

Figure 4A:
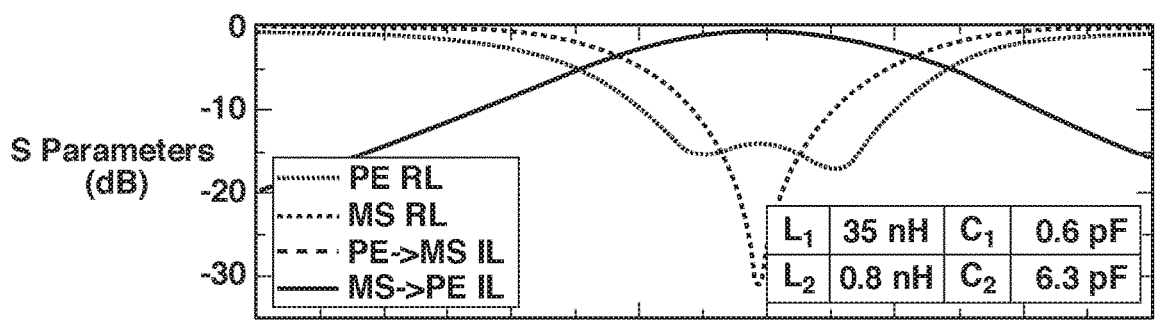
FIGS. 4A and 4B are graphs illustrating response of the gyrator of FIG. 2A with a 50-ohm matched network showing, respectively: (A) return loss (RL) and insertion loss (IL) for the piezoelectric and magnetostrictive ports; and (B) corresponding phase, according to various embodiments.
Figure 4B:
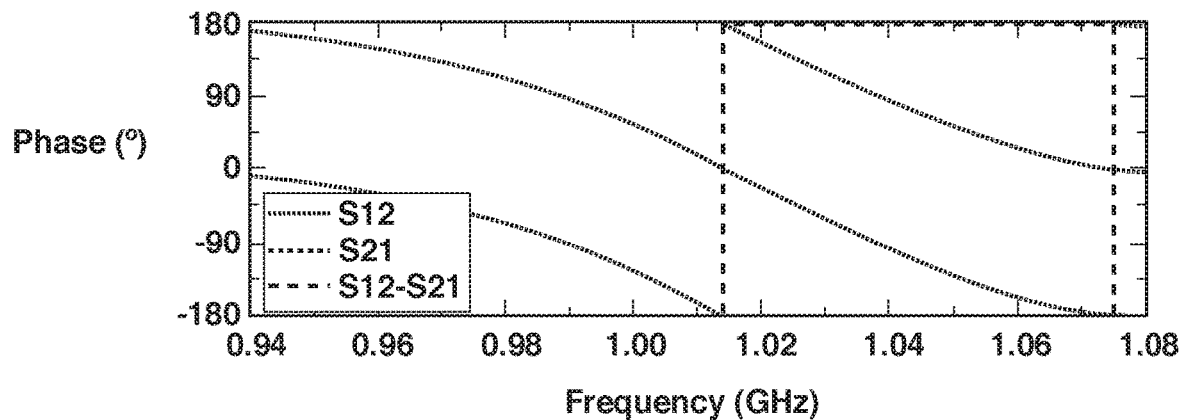

FIGS. 4A and 4B are graphs illustrating response of the gyrator of FIG. 2A with a 50-ohm matched network showing, respectively: (A) return loss (RL) and insertion loss (IL) for the piezoelectric and magnetostrictive ports; and (B) corresponding phase, according to various embodiments. Note that the response is of the device as a gyrator and to 50Ω with operation frequency close to 1 GHz. The matching networks 318A and 318B were included in the model, with the values of the lumped elements (inductor and capacitor) summarized in the inset. Note that in the inset of FIG. 4A, the term "PE" stands for piezoelectric and "MS" stands for magnetostrictive. As notable from FIG. 4B, a phase difference between S12 and S21 of 180° is observed, which indicates the anti-reciprocal behavior of the gyrator 200. A small insertion loss is only attained near the resonance frequency.

Figure 5A:
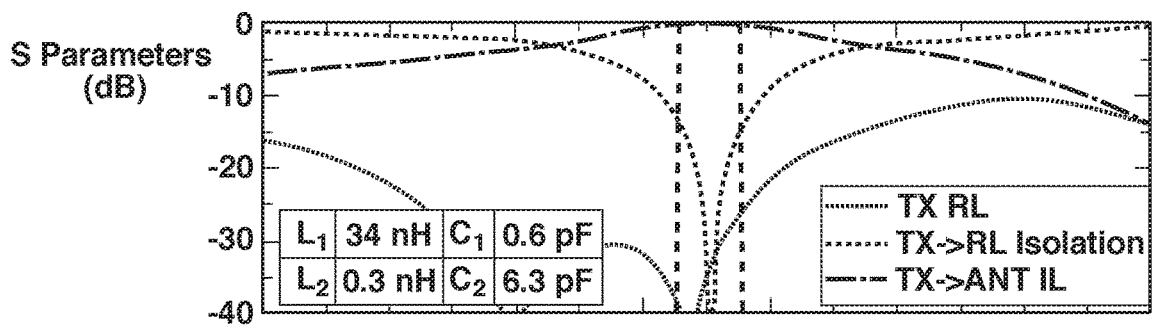
FIGS. 5A and 5B are graphs illustrating response of the circulator of FIG. 3 with a 50-ohm matched network showing, respectively: (A) return loss (RL) and insertion loss (IL) for the piezoelectric and magnetostrictive ports; and (B) corresponding phase, according to various embodiments.
Figure 5B:
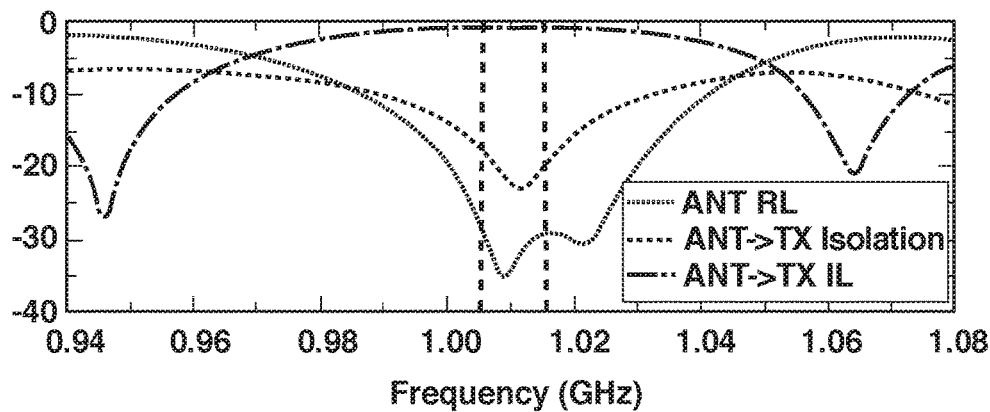

FIGS. 5A and 5B are graphs illustrating response of the circulator of FIG. 3 with a 50-ohm matched network showing, respectively: (A) return loss (RL) and insertion loss (IL) for the piezoelectric and magnetostrictive ports; and (B) corresponding phase, according to various embodiments. The term "ANT" in the inset of FIG. 5B stands for "antenna," e.g., the antenna 333 of the single-frequency transceiver 300 of FIG. 3. The response of the circulator may assume that the antenna, TX, and RX impedances are 50Ω. A TX-to-RX isolation larger than 25 dB with insertion loss below 2 dB, for both transmission and reception, can be attained for a bandwidth over 20 MHz. Higher bandwidth and performance are obtained when using higher order matching networks or assuming larger resonator Q, for example.

Further calculations reveal that a 100×100 μm$^2$ gyrator/circulator device biased by an external field of one ("1") T is expected to handle an input power in excess of 30 dBm without significant distortion. Increasing the device size will reduce the maximum strain for a given power level, which translates into higher power handling limit and linearity, and allows for a lower bias point of the gyrator 200.

By way of summary, some features of the gyrator 200 and the circulator of the single-frequency transceiver 300 may include, but are not limited to the following. The design of mechanically coupled piezomagnetic and piezoelectric transducers enables drastic reduction in circulator size due to the much smaller wavelength of acoustic waves at RF. A thickness mode operation is conceived for the cooperative design of piezoelectric and piezomagnetic transducers so that the magnetic biasing can be conveniently incorporated and the more challenging performance specifications, power handling, and linearity, can also be satisfied. A thickness mode operation also maximizes coupling and Q for the piezoelectric transducer. For the application of the gyrator as a circulator, the noise figure is simply the insertion loss, which is minimized for the disclosed a chip-based device given the high magnetoelectric transduction and low overall loss in both EM and acoustic domains. This approach is particularly advantageous when compared to modulation based non-reciprocal devices, because those devices inevitably harbor noise from dynamic biasing sources.

Figure 6A:
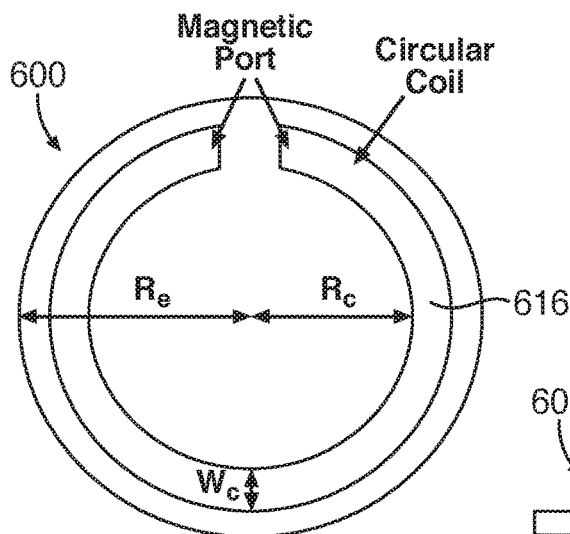
FIGS. 6A and 6B are a top view and a cross-sectional view, respectively, of a magneoelectric micro-electro-mechanical system (MEMS) gyrator according to one embodiment.
Figure 6B:
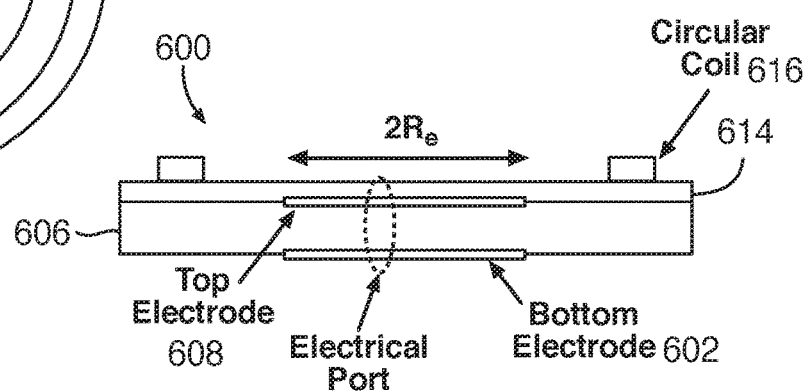

FIGS. 6A and 6B are a top view and a cross-sectional view, respectively, of a magneoelectric micro-electro-mechanical system (MEMS) gyrator 600 (e.g., gyrator 600) according to one embodiment. Note that the gyrator 600 illustrated includes a pair of metal electrodes, a bottom electrode 602 and a top electrode 608, with a piezoelectric layer 606 sandwiched therebetween. The bottom and top electrodes in this embodiment may be circular and located concentrically within a diameter of a metal coil 616 that is deposited on the magnetostrictive layer 614. As illustrated in FIG. 6A, a radius of the metal coil 616 is labeled as $R_c$ and the radius of the electrodes 602 and 608 is labeled as $R_e$. Accordingly, the diameter ($2R_e$) of the metal electrodes is concentrically smaller than the diameter of the metal coil 616 so that there is lateral gap therebetween.

FIG. 7 is a cross-sectional view of the schematic diagram of FIG. 6B, illustrating magnetostrictive and piezoelectric transduction, according to one embodiment. The design of the gyrator 600 of FIG. 6 lends to the creation of a magnetic field 703 around the metal coil 616. This design leads to creation of a region 705 for magnetostrictive transduction and a separate region 707 for piezoelectric transduction.

In various embodiments, the magnetostrictive transduction is mainly focused in the area close to the coil where the magnetic field is strongest. The piezoelectric transduction mainly occurs between the top electrode 608 and the bottom electrode 602. It can be seen from FIG. 7 that certain space by way of a vertical gap is left between the metal coil 616 and the electrodes 601 and 608. This is because the magnetostrictive transduction decreases as the radius of the electrode ($R_e$) becomes closer to that of the coil ($R_c$). This reduction in magnetostrictive transduction is because the magnetic field penetrating the magnetostriction layer 614 may be highly reduced when electrodes are present underneath the magnetostriction layer 614.

Thus, as magnetostrictive transduction increases as $R_e$ becomes smaller. However, piezoelectric transduction also reduces when $R_e$ decreases because of a smaller piezoelectric transduction area. Considering that the total transduction of the gyrator is the sum of the magnetostrictive transduction and the piezoelectric transduction, there is an optimal value for $R_e$ that yields a highest total transduction for the gyrator with specified dimensions. This optimal value of $R_e$ may be obtained through finite element (FE) simulation in one embodiment. Given that the mechanical vibrations mainly occur in the thickness (e.g., lateral) direction, the lateral shape of the gyrator 600 does not affect the resonant frequency as long as the thickness for the combination of the magnetostriction layer 614 and the piezoelectric layer 606 is fixed.

FIGS. 8A and 8B are a top plane view of a pentagonal-shaped gyrator according to two embodiments, a first gyrator 800A that includes circularly-shaped metal electrodes and metal coil, and a second gyrator 800B that includes pentagonal-shaped metal electrodes and metal coil. Use of the pentagon as the lateral shape of these components is to help suppress the lateral vibration modes which may be found in FBAR structures.

FIGS. 9A and 9B are a top plane view and a cross-sectional view, respectively, of a magneoelectric MEMS gyrator 900 with separated magnetostrictive and piezoelectric transduction areas. For example, the gyrator 900 may include a bottom electrode 902, a piezoelectric layer 906, a top electrode 908, a magnetostrictive layer 914, and a metal coil 916 in layered ordered. In this embodiment, however, the bottom electrode 902 and the top electrode 908 may be misaligned laterally from the metal coil 916 in separate but mechanically-connected resonators, such as to form a lateral gap between the electrodes and the metal coil. In other words, the bottom electrode 902 and the top electrode 908 may be disposed at a first end of piezoelectric layer 906 and the metal coil 916 is disposed at a second end of the magnetostrictive layer 914 that corresponds to a second end of the piezoelectric layer 906. In the embodiment of FIGS. 9A and 9B, the electrodes and the metal coil may be pentagonal shapes, such as one of the embodiments illustrated in FIGS. 8A and 8B.

In this way, two pentagonal-shaped resonators—one as a piezoelectric resonator and another as a magnetostrictive resonator—are mechanically coupled while magnetostrictive transduction occurs only in the magnetostrictive resonator and the piezoelectric transduction only occurs in the magnetostrictive resonator. The advantage of separating the transduction area is that the size of the piezoelectric transduction is no longer limited by the size of the coil. Although the pentagon resonator and circular coil are used as an example here, it should be noted that other lateral shapes for resonators and the metal coil may be adopted with varying degrees of transduction.

Figures 10, 11:
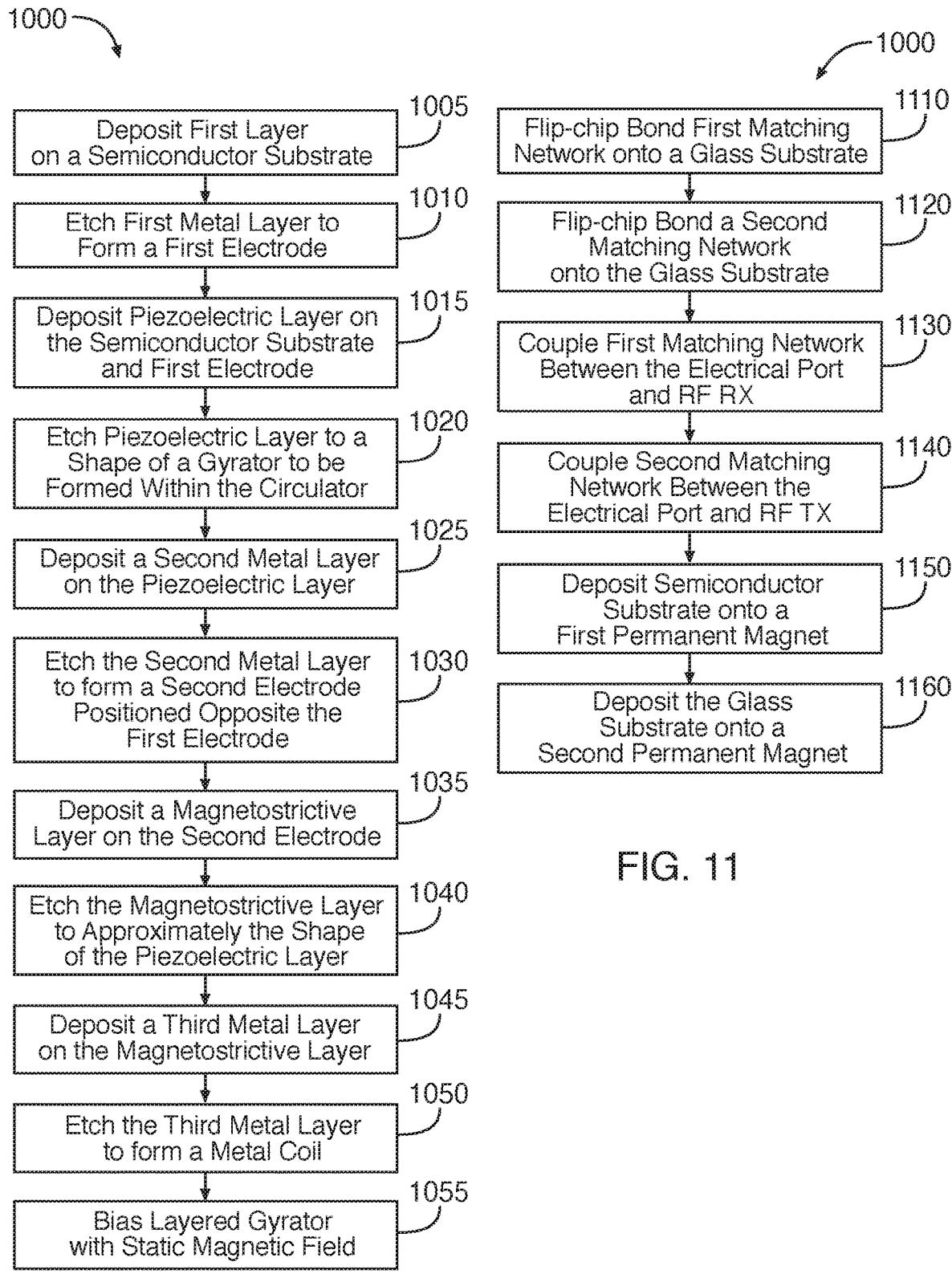
FIG. 10 is a flow chart of a method for creating a gyrator, according to various embodiments.
FIG. 11 is a flow chart of a method for creating a circulator using the gyrator formed in the method of FIG. 10, according to various embodiments.

FIG. 10 is a flow chart of a method 1000 for creating a gyrator, such as the disclosed gyrator 200, 600, 900, or a combination of these designs according to the various disclosed embodiments. The method 1000 may be performed by integrated circuit process machinery and electronics, including chemical vapor deposition (CVD), molecular beam vapor deposition (MBVD), sputtering, sol-gel methods, liquid phase epitaxy, or the like.

With reference to FIG. 10, the method 1000 may begin with depositing a first metal layer on a semiconductor substrate, such as a silicon-based substrate (1005). The method 1000 may continue with etching the first metal layer to form a first electrode having a first lead (1010). The method 1000 may continue with depositing a piezoelectric layer on the semiconductor substrate and first electrode (1015). The method 1000 may continue with etching the piezoelectric layer to a shape of the gyrator to be formed within the circulator (1020). The method 1000 may continue with depositing a second metal layer on the piezoelectric layer (1025). The method 1000 continued with etching the second metal layer to form a second electrode having a second lead, the second electrode being positioned opposite the first electrode (1030). The first lead and the second lead form an electrical port. The method 1000 may continue with depositing a magnetostrictive layer on the second electrode (1035). The method 1000 may continue with etching the magnetostrictive layer to approximately the shape of the piezoelectric layer (1040). The method 1000 may continue with depositing a third metal layer on the magnetostrictive layer (1045). The method 1000 may continue with etching the third metal layer to form a metal coil that has a gap on one side to define a magnetic port (1050). The method 1000 may continue with biasing the layered gyrator with a static magnetic field, e.g., through the application of a permanent magnet to either side of the gyrator (1055).

FIG. 11 is a flow chart of a method 1100 for creating a circulator, such as the single-frequency transceiver 300, using the gyrator formed in the method 1000 of FIG. 10, according to various embodiments. The method 1000 may be performed by integrated circuit process machinery and electronics, including chemical vapor deposition (CVD), molecular beam vapor deposition (MBVD), sputtering, sol-gel methods, liquid phase epitaxy, or the like.

With reference to FIG. 11, the method 1100 may start with flip-chip bonding of a first matching network onto a glass substrate (1110) and flip-chip bonding of a second matching network onto the glass substrate (1120). The method 1100 may continue with coupling the first matching network between the electrical port and a radio frequency (RF) receiver (1130). The method 1100 may continue with coupling the second matching network between the magnetic port and an RF transmitter (1140). The RF receiver and the RF transmitter may provide full duplex communication in an RF radio. The method 1100 may continue with depositing the semiconductor substrate onto a first permanent magnet (1150). The method 1100 may continue with depositing the glass substrate onto a second permanent magnet (1160). The first permanent magnet and the second permanent magnet are to apply a static magnetic field bias to the gyrator.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. An integrated circuit, comprising:
   a first metal electrode disposed on a semiconductor substrate, the first metal electrode having a first lead;
   a piezoelectric layer disposed on the first metal electrode;
   a second metal electrode disposed on the piezoelectric layer, the second metal electrode having a second lead, wherein the first lead and the second lead form an electrical port across which to receive an alternating current (AC) voltage, wherein the first metal electrode and the second metal electrode are to apply the AC voltage across the piezoelectric layer to cause a time-varying strain in the piezoelectric layer;
   a magnetostrictive layer disposed on the second metal electrode, wherein the magnetostrictive layer is to translate the time-varying strain, received via a vibration mode from interaction with the piezoelectric layer, into a time-varying electromagnetic field; and
   a metal coil having a magnetic port, the metal coil disposed on the magnetostrictive layer and to induce a current at the magnetic port based on the time-varying electromagnetic field generated by the magnetostrictive layer.

2. The integrated circuit of claim 1, wherein the first metal electrode, the piezoelectric layer, the second metal electrode, and the magnetostrictive layer are arranged in a thin-film bulk acoustic resonator configuration.

3. The integrated circuit of claim 1, wherein the vibration mode is defined by a resonance based on a combined thickness of the piezoelectric layer and the magnetostrictive layer, and wherein the vibration mode facilitates non-reciprocal behavior between the electrical port and the magnetic port.

4. The integrated circuit of claim 1, wherein the first metal electrode, the second metal electrode, and the metal coil are one of circular or pentagonal in shape, and wherein the first and second metal electrodes are concentrically smaller than the metal coil in width and positioned within a width of the metal coil in a thickness direction such as to define a lateral gap between the first and second metal electrodes and the metal coil.

5. The integrated circuit of claim 1, further comprising:
   a glass substrate layer disposed such as to form a gap from the metal coil;
   a first matching network disposed on an inner side of the glass substrate layer and coupled between the electrical port and a radio frequency (RF) receiver; and
   a second matching network disposed on the inner side of the glass substrate layer and coupled between the magnetic port and an RF transmitter, the RF receiver and the RF transmitter to provide full duplex communication in an RF radio.

6. The integrated circuit of claim 5, wherein the first metal electrode is disposed on an inner side of the semiconductor substrate, further comprising:
   a first permanent magnet coupled to an outer side of the semiconductor substrate; and
   a second permanent magnet coupled to an outer side of the glass substrate layer, wherein the first permanent magnet and the second permanent magnet are to apply a static magnetic field bias.

7. The integrated circuit of claim 1, further comprising a radio frequency (RF) antenna coupled between the electrical port and the magnetic port.

8. The integrated circuit of claim 1, wherein the piezoelectric layer comprises aluminum nitride (AlN).

9. The integrated circuit of claim 1, wherein the magnetostrictive layer comprises manganese iron oxide ($MnFe_2O_4$).

10. An integrated circuit comprising:
    a first metal electrode disposed on a semiconductor substrate, the first metal electrode having a first lead;
    a piezoelectric layer disposed on the first metal electrode;
    a second metal electrode disposed on a first end of the piezoelectric layer opposite the first metal electrode, the second metal electrode having a second lead, wherein the first lead and the second lead form an electrical port, wherein the first metal electrode and the second metal electrode are to induce current at the electrical port in response to a time-varying strain in the piezoelectric layer;
    a magnetostrictive layer disposed on the second metal electrode and on a second end of the piezoelectric layer; and
    a metal coil having a magnetic port, the metal coil disposed on a second end of the magnetostrictive layer that corresponds to the second end of the piezoelectric layer,
    wherein an alternating current (AC) current applied at the magnetic port is to cause a magnetic field to form within the magnetostrictive layer, wherein the magnetic field causes excitation in the magnetostrictive layer that translates into the time-varying strain within the piezoelectric layer.

11. The integrated circuit of claim 10, wherein the metal coil disposed on the second end of the magnetostrictive layer does not overlap in a thickness direction with the first and second metal electrodes disposed relative to a first end of the piezoelectric layer.

12. The integrated circuit of claim 10, wherein the time-varying strain is defined by a resonance based on a combined thickness of the piezoelectric layer and the magnetostrictive layer, and wherein at the resonance, the integrated circuit exhibits non-reciprocal behavior between the electrical port and the magnetic port.

13. The integrated circuit of claim 10, wherein the first metal electrode, the piezoelectric layer, and the second metal electrode are arranged in a thin-film bulk acoustic resonator configuration as a piezoelectric resonator, and wherein the magnetostrictive layer and the metal coil are arranged as a separate magnetostrictive resonator that is mechanically coupled to the piezoelectric resonator.

14. The integrated circuit of claim 10, further comprising:
a glass substrate layer disposed such as to form a gap from the metal coil;
a first matching network disposed on an inner side of the glass substrate layer and coupled between the electrical port and a radio frequency (RF) receiver; and
a second matching network disposed on the inner side of the glass substrate layer and coupled between the magnetic port and an RF transmitter, the RF receiver and the RF transmitter to provide full duplex communication in an RF radio.

15. The integrated circuit of claim 14, wherein the first metal electrode is disposed on an inner side of the semiconductor substrate, further comprising:
a first permanent magnet coupled to an outer side of the semiconductor substrate; and
a second permanent magnet coupled to an outer side of the glass substrate layer, wherein the first permanent magnet and the second permanent magnet are to apply a static magnetic field bias.

16. The integrated circuit of claim 10, further comprising a radio frequency (RF) antenna coupled between the electrical port and the magnetic port.

17. The integrated circuit of claim 10, wherein the piezoelectric layer comprises aluminum nitride (AlN), and wherein the magnetostrictive layer comprises manganese iron oxide ($MnFe_2O_4$).

18. The integrated circuit of claim 10, wherein the first metal electrode, the second metal electrode, and the metal coil are one of circular or pentagonal in shape.

* * * * *